(12) United States Patent
Akiyama

(10) Patent No.: US 7,375,878 B2
(45) Date of Patent: May 20, 2008

(54) OPTICAL REPEATER

(75) Inventor: Tomoyuki Akiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 82 days.

(21) Appl. No.: 10/716,662

(22) Filed: Nov. 20, 2003

(65) Prior Publication Data

US 2004/0101313 A1    May 27, 2004

(30) Foreign Application Priority Data

Nov. 21, 2002   (JP)   ............... 2002-338415

(51) Int. Cl.
*H04B 10/17*   (2006.01)
(52) U.S. Cl. .................. 359/344; 359/349
(58) Field of Classification Search ........ 359/341.42, 359/344
See application file for complete search history.

(56) References Cited

U.S. PATENT DOCUMENTS

| 4,752,120 | A | * | 6/1988 | Shimizu ............... 359/239 |
| 4,886,334 | A | * | 12/1989 | Aoki ................... 359/333 |
| 4,900,917 | A | * | 2/1990 | Dixon et al. .......... 250/225 |
| 4,923,291 | A | * | 5/1990 | Edagawa et al. ....... 359/334 |
| 4,941,738 | A | * | 7/1990 | Olsson ................. 359/347 |
| 4,952,017 | A | * | 8/1990 | Henry et al. .......... 359/344 |
| 5,151,818 | A | * | 9/1992 | Thijs et al. .......... 359/344 |
| 5,295,016 | A | * | 3/1994 | Van Deventer ......... 359/347 |
| 5,303,314 | A | * | 4/1994 | Duling et al. ......... 385/11 |
| 5,396,365 | A | * | 3/1995 | Gustavsson ............ 359/337 |
| 5,526,174 | A | * | 6/1996 | Saito ................. 359/337 |
| 5,659,560 | A | * | 8/1997 | Ouchi et al. .......... 372/27 |

(Continued)

FOREIGN PATENT DOCUMENTS

EP    0305995    3/1989

(Continued)

OTHER PUBLICATIONS

Bilenca, A. Alizon, R. Mikhelashvili, V. Eisenstein, G. Schwertberger, R. Gold, D. Reithmaier, J.P. Forch. InAs/InP 1550 nm quantum dash semiconductor optical amplifiers. Electronics Letters. Oct. 24, 2002. vol. 38, Issue: 22 pp. 1350-1351.*

(Continued)

*Primary Examiner*—Deandra M. Hughes
*Assistant Examiner*—Ari M Diacou
(74) *Attorney, Agent, or Firm*—Kratz, Quintos & Hanson, LLP

(57) ABSTRACT

On the upstream side of a quantum dot optical amplifier, a polarization beam splitter with one input and two outputs is provided. Two optical fibers connected to output sections of the polarization beam splitter are connected to input sections of the quantum dot optical amplifier in a state that both of the optical fibers have an electric field whose direction being adjusted to maximize its gain, and one optical fiber is twisted by 90° to the other optical fiber. On the downstream side of the quantum dot optical amplifier, a polarization beam splitter with two inputs and one output is provided. Between two optical fibers connected to the polarization beam splitter, one is twisted by 90° to the other. This twisting direction is reverse to the twisting direction of the two optical fibers connected to the input sections of the quantum dot optical amplifier.

13 Claims, 5 Drawing Sheets

U.S. PATENT DOCUMENTS

| | | | |
|---|---|---|---|
| 5,793,511 A * | 8/1998 | Bulow | 398/147 |
| 5,822,100 A * | 10/1998 | Robinson et al. | 398/147 |
| 5,822,352 A * | 10/1998 | Mizutani et al. | 372/50.122 |
| 5,901,166 A * | 5/1999 | Nitta et al. | 372/50.1 |
| 6,023,366 A * | 2/2000 | Kinoshita | 359/337.12 |
| 6,026,107 A * | 2/2000 | Huang | 372/50.1 |
| 6,046,839 A * | 4/2000 | Ito et al. | 359/246 |
| 6,151,428 A * | 11/2000 | Vahala et al. | 385/11 |
| 6,175,446 B1 * | 1/2001 | Alphonse | 359/344 |
| 6,252,698 B1 * | 6/2001 | Oikawa | 359/326 |
| 6,252,895 B1 * | 6/2001 | Nitta et al. | 372/50.1 |
| 6,256,137 B1 * | 7/2001 | Hironishi | 359/332 |
| 6,370,285 B1 * | 4/2002 | Naganuma | 385/11 |
| 6,384,966 B1 * | 5/2002 | Dymott | 359/347 |
| 6,421,169 B1 | 7/2002 | Bonnedal et al. | 359/337.1 |
| 6,487,007 B1 * | 11/2002 | Morito | 359/344 |
| 6,545,801 B2 * | 4/2003 | Morito | 359/344 |
| 6,646,975 B1 * | 11/2003 | Uchizaki et al. | 369/121 |
| 7,002,733 B2 * | 2/2006 | Dagenais et al. | 359/337 |
| 2001/0002895 A1 * | 6/2001 | Kawano et al. | 369/103 |
| 2001/0043390 A1 * | 11/2001 | Kim et al. | 359/344 |
| 2002/0051615 A1 * | 5/2002 | Walpole et al. | 385/131 |
| 2002/0063945 A1 * | 5/2002 | Shichijyo et al. | 359/326 |
| 2002/0067527 A1 * | 6/2002 | Akiyama | 359/135 |
| 2002/0110306 A1 * | 8/2002 | Hamada | 385/11 |
| 2002/0171920 A1 * | 11/2002 | Sugawara | 359/344 |
| 2003/0067678 A1 * | 4/2003 | Shibata et al. | 359/344 |
| 2004/0062285 A1 * | 4/2004 | Uchizaki et al. | 372/50 |
| 2005/0117200 A1 * | 6/2005 | Akiyama et al. | 359/326 |

FOREIGN PATENT DOCUMENTS

| | | | |
|---|---|---|---|
| EP | 0615323 A2 | | 9/1994 |
| EP | 634823 A1 * | | 1/1995 |

OTHER PUBLICATIONS

Quantum Dot. Wikipedia: The Worlds Free Encyclopedia. Uploaded: Oct. 15, 2005. Downloaded: Oct. 19, 2005. http://en.wikipedia.org/wiki/Quantum_dot.*

Quantum-dot pioneers target telecoms rebound. Opto & Laser Europe. Aug. 2002. Reprinted on optics.org. http://optics.org/articles/ole/7/8/2/1. Downloaded Oct. 19, 2005.*

K S Chan and J H Wei. The Gain and Related Characteristics of Self-Assembled Quantum Dash□□Structures. Unknown Publication Means. Downloaded: Oct. 20, 2005. http://www.ieeecet.org/submission/Application%5CNP%5CSessionID%5C68-NP-A0027.pdf.*

Quantum-dot devices get a funding boost. May 31, 2002. Coumpound Semiconductor. Reprinted on CompoundSemiconductor.net. http://www.compoundsemiconductor.net/articles/news/6/5/25/1□□.*

Holtmann et al; "Monolithically Integrated Gain-Clamped Semiconductor Optical Amplifier Exploiting Mach-Zehnder Interferometer Configuration" *WeD.3.4—22$^{nd}$ Eur.Conf. On Optical Comm.—EEOC'96, Oslo*, 3, 199 (1996) pp. 199-202.

European Search Report dated Mar. 26, 2004.

Patent Abstracts of Japan, Publication No. 2000-40852, dated Feb. 8, 2000/Discussed in the specification.

Patent Abstracts of Japan, Publication No. 2001-57455, dated Feb. 27, 2001/Discussed in the specification.

* cited by examiner

OPTICAL REPEATER

CROSS-REFERENCE TO RELATED APPLICATIONS

This application is based upon and claims the benefit of priority from the prior Japanese Patent Application No. 2002-338415, filed on Nov. 21, 2002, the entire contents of which are incorporated herein by reference.

BACKGROUND OF THE INVENTION

1. Field of the Invention

The present invention relates to an optical repeater that is preferable as a 1R repeater of optical communication.

2. Description of the Related Art

For lowering the cost of metro-access optical communication networks, WDM (Wavelength Division Multiplexing) communication having a large wavelength interval between channels (Coarse WDM communication) is expected to be widely used in the coming years. The wavelength interval in the Coarse WDM communication is approximately equal to or less than 20 nm. In this system, it becomes possible to lower costs for such reasons that it is not necessary to precisely control wavelengths of a light source and a filter, and a cooler used for keeping the temperature of a semiconductor laser of a light source is unnecessary because a certain amount of wavelength variation is tolerated.

In optical communication, an optical repeater is used for a purpose such as amplifying an attenuated optical signal. As the optical repeater, there exists a type in which a semiconductor optical amplifier and a gain equalizing filter are used. Regarding the semiconductor optical amplifiers, there exists a type in which a quantum well structure or a distorted quantum well structure is used for its active layer.

In a metro communication network over a long distance, a 1R repeater is indispensable to compensate for loss in each node of the metro communication network. A 1R repeater performs re-amplification of an optical signal and outputs it without converting it to an electrical signal.

Prior art is disclosed in Japanese Patent Laid-open No. 2000-40852 and in Japanese Patent Laid-open No. 2001-57455, for example.

However, in the Coarse WDM communication, the wavelength range (band) to be used is so wide as to range from 1.3 µm to 1.6 µm, so that it is impossible to be amplified by a single conventional optical amplifier (having a band of 0.05 µm approximately), which increases the cost of amplifying the whole wavelength range. Consequently, conventional optical repeaters used in the Coarse WDM communication are also high-cost, so a cost reduction thereof has been desired.

SUMMARY OF THE INVENTION

The present invention is made in view of the above-described problems, and an object thereof is to provide a low cost optical repeater suitable for use in Coarse WDM communication having a wide bandwidth.

As a result of earnest studies, the inventor of the present invention has found that, in semiconductor optical amplifiers that include an active layer having a quantum well structure or the like, carrier density in the active layer improves at a critical current density by reducing the density of the active layer so that a gain spectrum can be broadband, but on the other hand, polarized wave dependency of the gain occurs due to asymmetry of the material of the active layer. As a result of the occurrence of such polarized wave dependency, amplification of a wide wavelength range by conventional optical amplifiers becomes difficult. Based on this viewpoint, the inventor of the present invention has devised the following aspects of the invention.

A first optical repeater according to the present invention has a semiconductor optical amplifier including an active layer that has one type of structure selected from a group composed of a quantum dot, a quantum wire, a quantum dash and a quantum well. Further, the optical repeater has a demultiplexer for dividing an inputted light into two components, and respective components of a light outputted from this demultiplexer are amplified by the semiconductor optical amplifier. Further, the optical repeater has a multiplexer for coupling two components of a light outputted from the semiconductor optical amplifier.

In this optical repeater, the demultiplexer is provided on the upstream side of the semiconductor optical amplifier, and the multiplexer is provided on the downstream side. Consequently, the polarized wave dependency found by the inventor of the present invention that is a drawback of conventional optical repeaters is resolved. As a result, optical amplification over a wide wavelength range becomes possible. In other words, the optical repeater according to the present invention makes it possible to amplify the entire wavelength range using a single unit, which allows drastic cost reduction.

A second optical repeater according to the present invention has a semiconductor optical amplifier including an active layer that has one type of structure selected from a group composed of a quantum dot, a quantum wire, a quantum dash and a quantum well. Further, the optical repeater has a demultiplexer for dividing an inputted light into a TE wave and a TM wave, a converter for converting the TM wave into a TE wave, and a multiplexer for coupling the TE wave outputted from the demultiplexer and the TE wave outputted from the converter. The light outputted from the multiplexer is amplified by the semiconductor optical amplifier.

In this optical repeater, the optical signal inputted to the semiconductor optical amplifier is only a TE wave, so that the polarized wave dependency found by the inventor of the present invention that is the drawback of conventional optical repeaters is resolved.

DETAILED DESCRIPTION OF THE PREFERRED EMBODIMENTS

Hereinafter, an optical repeater, in particular, a 1R repeater according to embodiments of the present invention will be explained concretely with reference to the attached drawings.

First Embodiment

Figure 1:
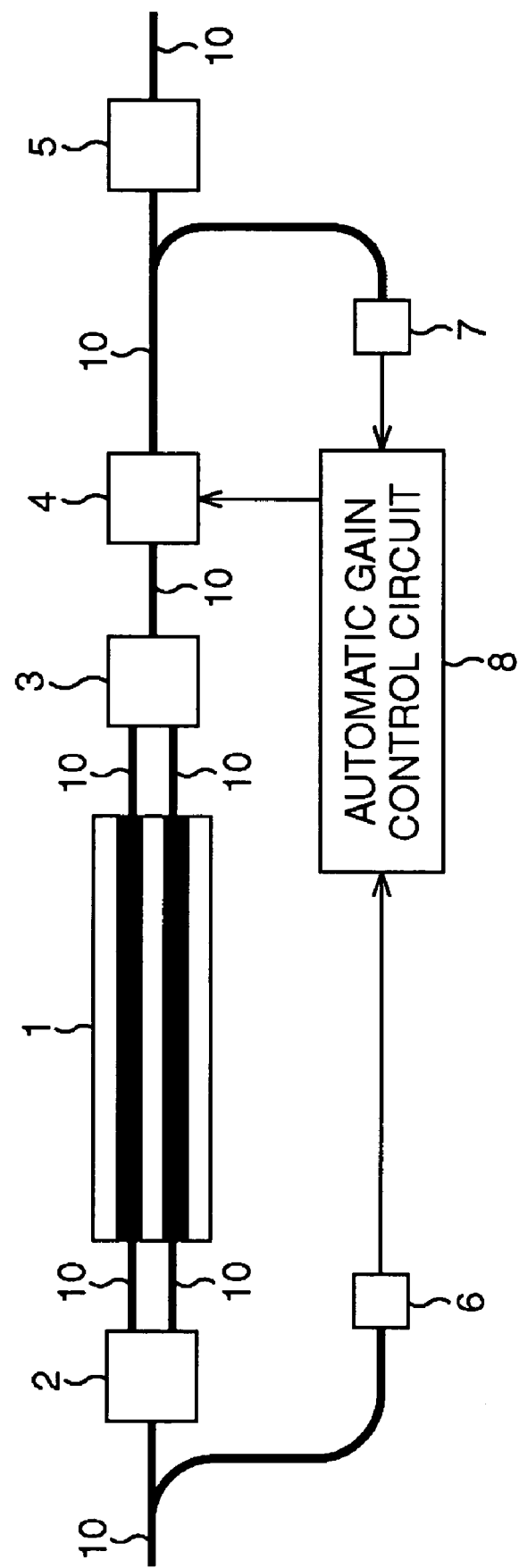
FIG. 1 is a schematic view showing the structure of an optical repeater according to a first embodiment of the present invention.

First, a first embodiment of the present invention will be explained. FIG. 1 is a schematic view showing the structure of an optical repeater according to the first embodiment of the present invention.

This embodiment has a quantum dot optical amplifier (semiconductor optical amplifier) 1 with two inputs and two outputs. The quantum dot optical amplifier 1 amplifies optical signals inputted to two input sections independently of each other. Specifically, the quantum dot optical amplifier 1 amplifies an optical signal inputted to one input section and outputs it thereafter from one output section, and amplifies an optical signal inputted to the other input section and outputs it thereafter from the other output section.

Figure 2:
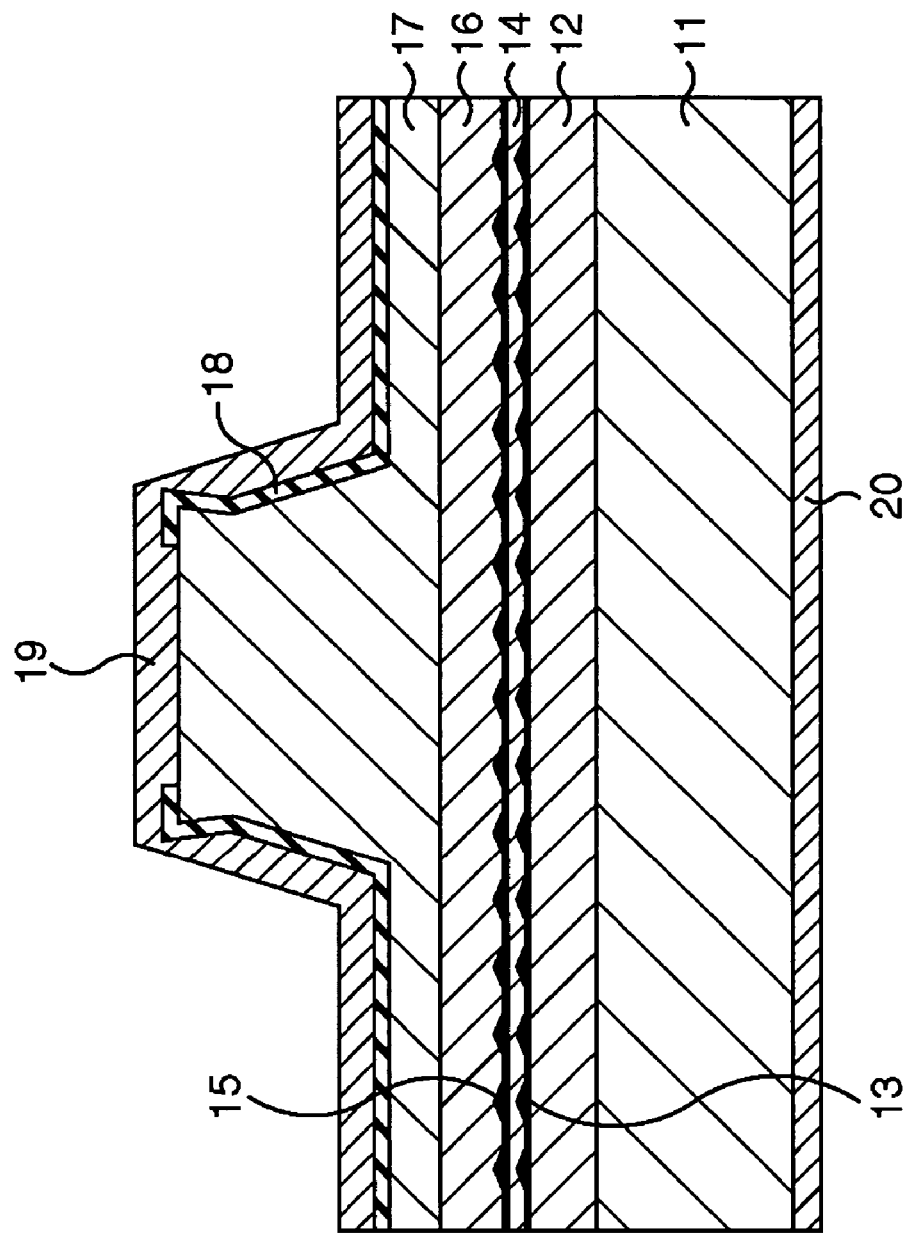
FIG. 2 is a cross-sectional view showing the structure of a quantum dot optical amplifier 1.

FIG. 2 is a cross-sectional view showing the structure of the quantum dot optical amplifier 1. FIG. 2 only shows a part corresponding to the one input and the one output.

In this quantum dot optical amplifier 1, an $In_{0.52}Al_{0.24}Ga_{0.24}As$ layer (InAlGaAs layer) 12 is formed on an n-type InP substrate 11. A surface of the n-type InP substrate 11 has a plane direction of (311) B. The InAlGaAs layer 12 has a thickness of, for example, 180 nm approximately. Further, on the InAlGaAs layer 12, an InAs SK dot layer 13 is formed. On the InAs SK dot layer 13, a plurality of projecting parts having a triangular pyramid shape are formed, which have a thickness of, for example, 1 to 3 nm approximately. Further, on the InAs SK dot layer 13, an $In_{0.52}Al_{0.24}Ga_{0.24}As$ layer (InAlGaAs layer) 14 is formed. The InAlGaAs layer 14 has a thickness of, for example, 30 nm approximately at the thickest part thereof. On the InAlGaAs layer 14, an InAs SK dot layer 15 is formed. On the InAs SK dot layer 15, similarly to the InAs SK dot layer 13, a plurality of projecting parts having a triangular pyramid shape are formed, which have a thickness of, for example, 1 to 3 nm approximately. On the InAs SK dot layer 15, an $In_{0.52}Al_{0.24}Ga_{0.24}As$ layer (InAlGaAs layer) 16 is formed. The InAlGaAs layer 16 has a thickness of, for example, 30 nm approximately at the thickest part thereof.

Furthermore, on the InAlGaAs layer 16, a p-type InP layer 17 is formed, and a $SiO_2$ layer 18 having an opening is formed thereon. On the $SiO_2$ layer 18, an electrode 19 connected to the p-type InP layer 17 via the opening is formed. Also, on a reverse surface of the n-type InP substrate 11, an electrode 20 is formed.

The quantum dot optical amplifier 1 with such a configuration amplifies and outputs an optical signal introduced into an active layer when a voltage is applied between the electrodes 19 and 20. However, as described above, this quantum dot optical amplifier 1 has polarized wave dependency, and thus it cannot amplify a specific electric field component using only the single structure shown in FIG. 2. Accordingly, in this embodiment, the quantum dot optical amplifier 1 has two structures shown in FIG. 2.

On the upstream side of the quantum dot optical amplifier 1, a polarization beam splitter (demultiplexer) 2 with one input and two outputs is provided. To the input section of the polarization beam splitter 2, one optical fiber 10 is connected, and to the two output sections of the polarization beam splitter 2, optical fibers 10 respectively connected to the input sections of the quantum dot optical amplifier 1 are connected one by one. The polarization beam splitter 2 divides an inputted optical signal into two electric field components that are orthogonal to each other, and output them from the two output sections. The two optical fibers 10 connected to the output sections of the polarization beam splitter 2 are connected to the input sections of the quantum dot optical amplifier 1 in a state that both of the optical fibers have an electric field whose direction being adjusted to maximize its gain (amplification efficiency). Specifically, the two electric field components outputted from the polarization beam splitter 2 are orthogonal to each other, so that one optical fiber 10 is twisted by 90° to the other optical fiber 10 between the polarization beam splitter 2 and the quantum dot optical amplifier 1.

On the downstream side of the quantum dot optical amplifier 1, a polarization beam splitter (multiplexer) 3 with two inputs and one output is provided. The polarization beam splitter 3 is provided to have the inputs and output in reverse to those of the polarization beam splitter 2. To the two input sections of the polarization beam splitter 3, optical fibers 10 respectively connected to the output sections of the quantum dot optical amplifier 1 are connected one by one, and to the output section of the polarization beam splitter 3, one optical fiber 10 is connected. The polarization beam splitter 3 couples inputted optical signals of two electric field components that are orthogonal to each other and outputs the coupled signal. However, the electric fields of optical signals outputted from the two output sections of the quantum dot optical amplifier 1 have directions corresponding to each other. Accordingly, in order to make these electric field components orthogonal to each other similarly to the optical signal inputted to the polarization beam splitter 2, the one optical fiber 10 is twisted by 90° to the other optical fiber 10. This twisting direction is reverse to the twisting direction of the two optical fibers 10 connected to the input sections of the quantum dot optical amplifier 1. Therefore, an optical signal outputted from the polarization beam splitter 3 is a signal in which all of the electric field components of the optical signal inputted to the polarization beam splitter 2 are amplified.

On the downstream side of the polarization beam splitter 3, a variable optical attenuator 4 and a gain equalizing filter 5 are provided. The polarization beam splitter 3, the variable optical attenuator 4 and the gain equalizing filter 5 are connected to each other via the optical fiber 10. An optical signal outputted from the gain equalizing filter 5 is outputted as an output signal of the optical repeater. Further, an optical detector 6 to which an inputted signal (optical signal) to the optical repeater is inputted, an optical detector 7 to which an optical signal outputted from the variable optical attenuator 4 is inputted, and an automatic gain control circuit 8 that performs control of the variable optical attenuator 4 based on output signals (electric signals) of the optical detectors 6 and 7 are provided.

The variable optical attenuator 4 attenuates, based on the control performed by the automatic gain control circuit 8, an optical signal outputted from the polarization beam splitter 3 regardless of its wavelength, and outputs the attenuated signal. The gain equalizing filter 5 substantially uniformizes a gain of an optical signal outputted from the variable optical attenuator 4 within a predetermined range, and outputs the substantially uniformized signal. The automatic gain control circuit 8 controls, based on output signals of the optical detectors 6 and 7, the degree of attenuation in the variable optical attenuator 4 so as to make a gain in the optical repeater to be a predetermined value.

When an optical signal is inputted to the optical repeater according to this embodiment with the above-described configuration, this optical signal is divided by the polarization beam splitter 2, and its intensity is detected by the optical detector 6. This intensity is converted into an electric signal and outputted to the automatic gain control circuit 8. Thereafter, optical signals outputted from the polarization beam splitter 2 are amplified by the quantum dot optical amplifier 1 and coupled by the polarization beam splitter 3. A gain of the optical signal is then adjusted by the variable optical attenuator 4, and the gain is equalized between its wavelengths by the gain equalizing filter 5. The optical signal outputted from the variable optical attenuator 4 is also inputted to the optical detector 7, and its intensity is detected therein. This intensity is converted into an electric signal and outputted to the automatic gain control circuit 8. Incidentally, the gain adjustment by the variable optical attenuator 4 is controlled by the automatic gain control circuit 8.

According to this embodiment, with the polarization beam splitters 2 and 3, the polarized wave dependency found by the inventor of the present invention that is a drawback of conventional optical repeaters is resolved. As a result, optical amplification of a wide wavelength range becomes possible. In other words, it becomes possible to amplify an optical signal having a wide wavelength range, which allows drastic cost reduction.

Incidentally, in the structure shown in FIG. 2, two layers that are the InAs SK dot layers 13 and 15 are formed as the active layer. However, the number of active layers is not particularly limited, which may be one layer, three layers or more.

Second Embodiment

Figure 3:
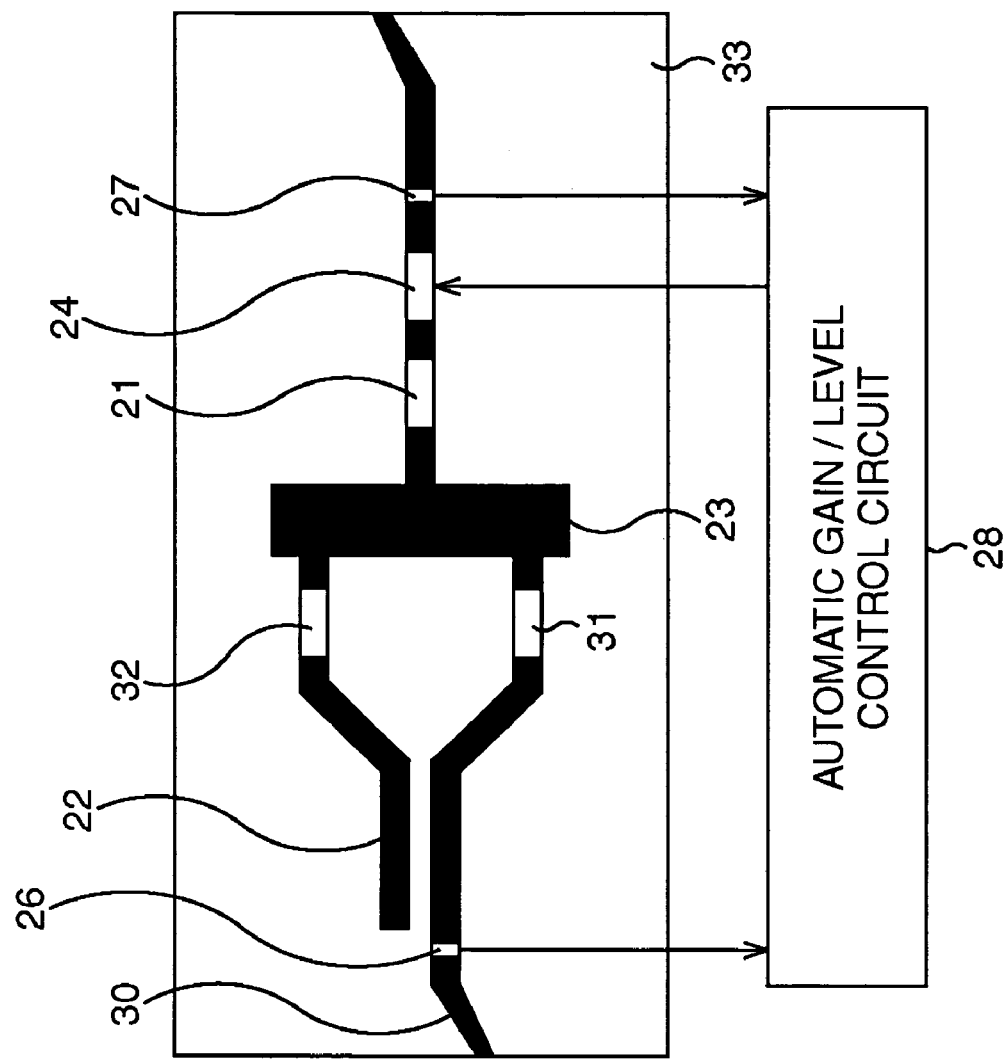
FIG. 3 is a schematic view showing the structure of an optical repeater according to a second embodiment of the present invention.

Next, a second embodiment of the present invention will be explained. In this embodiment, elements are monolithically integrated on a semiconductor substrate. FIG. 3 is a schematic view showing the structure of an optical repeater according to the second embodiment of the present invention.

In this embodiment, on a semiconductor substrate that is an InP substrate 33 for example, an optical detector 26, a TE/TM demultiplexer 22, a TE/TM converter 31, a phase controller 32, a multiplexer 23, a quantum dot optical amplifier 21, an intensity modulator (variable optical attenuator) 24, and an optical detector 27 are monolithically integrated. The TE/TM converter 31 and the phase controller 32 are arranged so as to respectively input a light of a TM mode and a light of a TE mode outputted from the TE/TM demultiplexer 22. The multiplexer 23 is arranged so as to couple lights outputted from the TE/TM converter 31 and the phase controller 32 to output the coupled light.

Further, an automatic gain/level control circuit 28 that performs control of the intensity modulator 24 based on intensities of lights detected by the optical detectors 26 and 27, and a gain equalizing filter (not-shown) are provided separately from the InP substrate 33.

Incidentally, an input terminal and an output terminal of a waveguide 30 are slanted by about 10° from a vertical direction of end surfaces of the InP substrate 33. Also, on the end surfaces of the InP substrate 33, broadband antireflection coatings are applied.

When an optical signal is inputted to the optical repeater according to the second embodiment with the above-described configuration, an intensity of the optical signal is detected by the optical detector 26, and this optical signal is thereafter divided by the TE/TM demultiplexer 22 into a TE wave and a TM wave. The intensity detected by the optical detector 26 is converted into an electric signal and outputted to the automatic gain/level control circuit 28. The TM wave is inputted to the TE/TM converter 31, converted into a TE wave and thereafter outputted. On the other hand, the TE wave outputted from the TE/TM demultiplexer 22 is controlled in its phase by the phase controller 32 in such a manner that the TE wave outputted from the TE/TM converter 31 and the TE wave outputted from the phase controller 32 intensify with each other in the multiplexer 23, and is thereafter outputted.

Thereafter, the TE wave outputted from the TE/TM converter 31 and the TE wave outputted from the phase controller 32 are intensified with each other and coupled by the multiplexer 23, and outputted in a TE mode from the multiplexer 23. This outputted signal is amplified by the quantum dot optical amplifier 21. This outputted signal is then modulated in its intensity by the intensity modulator 24, thereafter inputted to the optical detector 27, and its intensity is detected therein. This intensity is converted into an electric signal and outputted to the automatic gain/level control circuit 28. The modulation of intensity by the intensity modulator 24 is controlled by the automatic gain/level control circuit 28. An optical signal outputted from the optical detector 27 is outputted from the InP substrate 33, and its gain is equalized between its wavelengths by a gain equalizing filter (not-shown) connected to the InP substrate 33 with, for example, an optical fiber.

According to this embodiment, with the TE/TM demultiplexer 22 and the multiplexer 23, the polarized wave dependency found by the inventor of the present invention that is a drawback of conventional optical repeaters is resolved. As a result, similarly to the first embodiment, it becomes possible to amplify an optical signal having a wide wavelength range, which allows drastic cost reduction.

Figure 4:
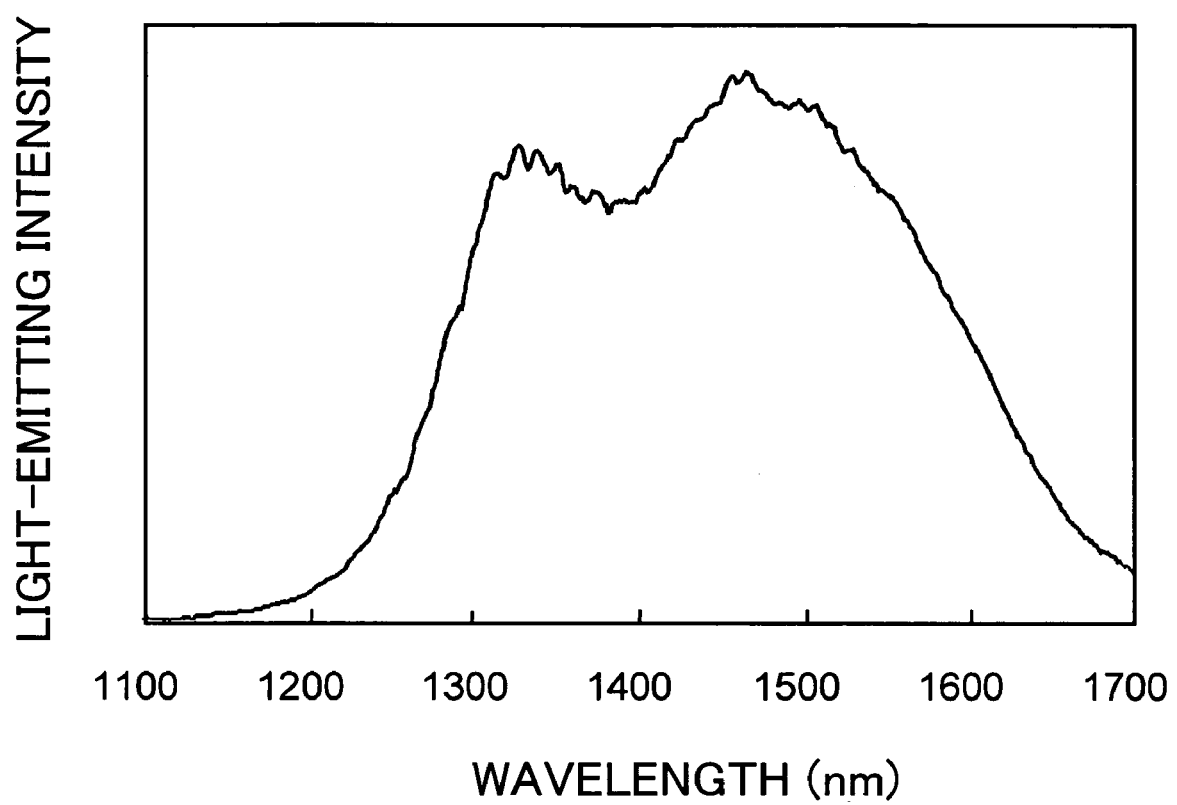
FIG. 4 is a graph showing an ASE (Amplitude Spontaneous Emission) spectrum that is actually obtained.

When the inventor of the present invention actually fabricated the optical repeater (the second embodiment) shown in FIG. 3 and measured its gain spectrum, a result shown in FIG. 4 was obtained. As shown in FIG. 4, a high light-emitting intensity was obtained for a broadband wavelength ranging from 1300 nm to 1600 nm. By the conventional optical repeater, an effective light-emitting intensity is obtained, even with wider estimation, only in a range from 70 nm to 80 nm between 1500 nm to 1600 nm approximately.

In addition, in this fabricated optical repeater, dependency of its gain on a polarized wave was quite low, and the gain was approximately uniform over a broadband wavelength. Further, automatic control of the gain was also possible.

Third Embodiment

Figure 5:
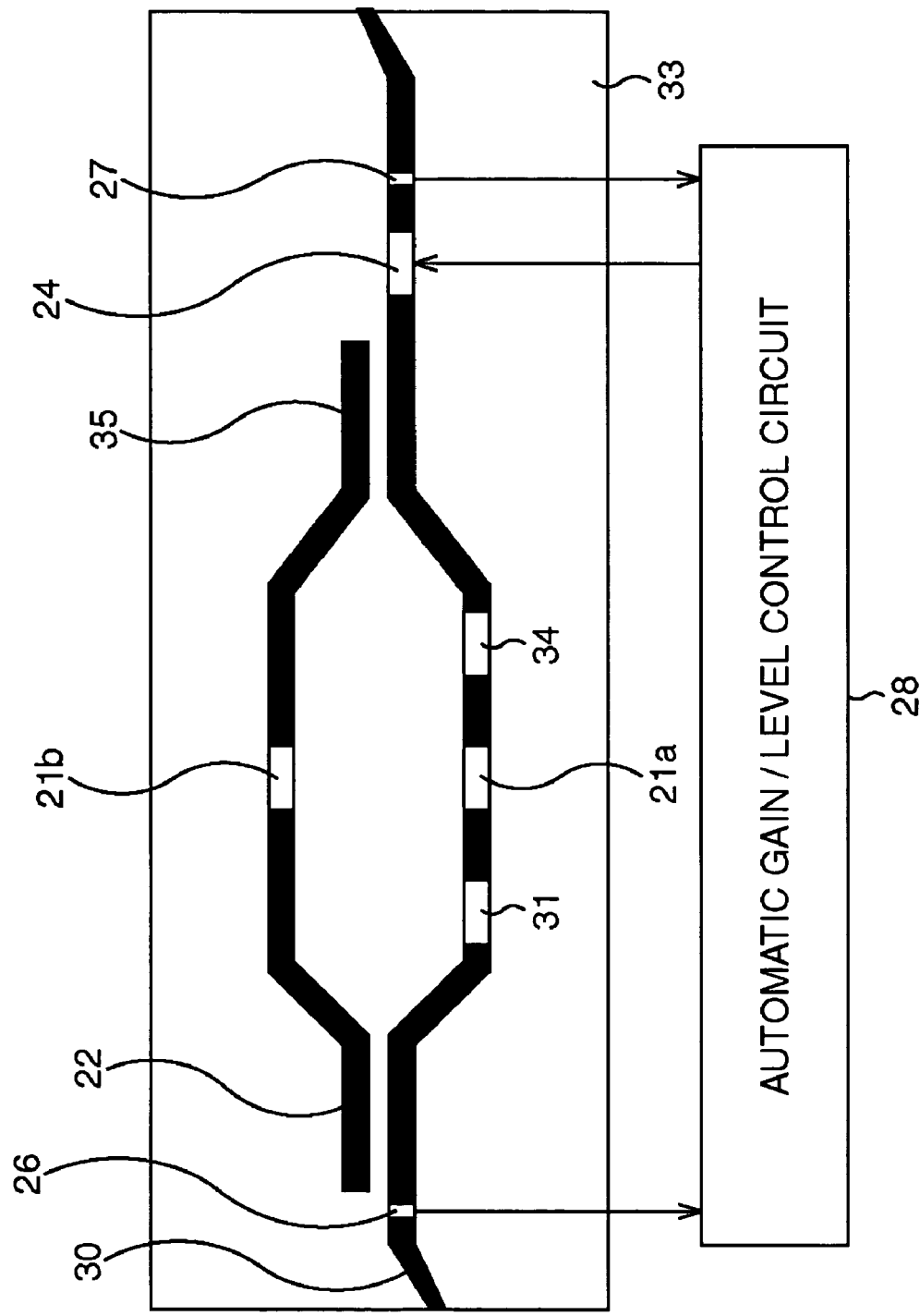
FIG. 5 is a schematic view showing the structure of an optical repeater according to a third embodiment of the present invention.

Next, a third embodiment of the present invention will be explained. Also in the third embodiment, similarly to the second embodiment, elements are monolithically integrated on a semiconductor substrate. FIG. 5 is a schematic view showing the structure of an optical repeater according to the third embodiment of the present invention.

In this embodiment, on a semiconductor substrate that is an InP substrate 33 for example, an optical detector 26, a TE/TM demultiplexer 22, a TE/TM converter 31, quantum dot optical amplifiers 21a and 21b, a TE/TM converter 34, a TE/TM demultiplexer 35, an intensity modulator 24 and an optical detector 27 are monolithically integrated.

The TE/TM converter 31 is arranged so as to input a light of a TM mode outputted from the TE/TM demultiplexer 22. The quantum dot optical amplifier 21a is arranged so as to input a TE wave outputted from the TE/TM converter 31, and the quantum dot optical amplifier 21b is arranged so as to input a TE wave outputted from the TE/TM demultiplexer 22. The TE/TM converter 34 is arranged in a reverse direction of the TE/TM converter 31, and a TE wave outputted from the quantum dot optical amplifier 21a is converted into a TM wave by the TE/TM converter 34.

Further, the TE/TM demultiplexer 35 is arranged in a reverse direction of the TE/TM demultiplexer 22, and a TE wave outputted from the quantum dot optical amplifier 21b and a TM wave outputted from the TE/TM converter 34 are coupled by the TE/TM demultiplexer 35.

By the third embodiment configured as above, the similar effects as those of the second embodiment can be obtained.

Fourth Embodiment

Next, a fourth embodiment of the present invention will be explained. In the fourth embodiment, elements are integrated as a PLC (Planar Lightwave Circuit) on a quartz substrate. Specifically, waveguides are formed on the quartz substrate, and on this quartz substrate, among the components shown in FIG. 1, the quantum dot optical amplifier 1, the polarization beam splitters 2 and 3, the variable optical attenuator 4, and the light detectors 6 and 7 are integrated as the PLC.

By the fourth embodiment configured as above, the similar effects as those of the first embodiment can be obtained.

When the optical detectors 26 and 27, the TE/TM demultiplexer 22, the TE/TM converter 31, the phase controller 32, the multiplexer 23, the quantum dot optical amplifier 21, and the intensity modulator 24 among the components of the second embodiment shown in FIG. 3 are integrated as the PLC on a quartz substrate, the similar effects can be obtained.

Incidentally, in the first to fourth embodiments, the quantum dot optical amplifier is used as an optical amplifier, but a quantum wire optical amplifier, a quantum dash optical amplifier, or a quantum well optical amplifier may be used.

Further, for controlling the variable optical attenuator and the intensity modulator, an output power may be controlled based only on an intensity detected by the optical detector on the output side.

Further, the gain equalizing filter may be integrated as a semiconductor with the semiconductor optical amplifier.

As described in detail above, according to the present invention, a broadband optical signal can be repeated, which is suitable for use in Coarse WDM communication for example.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. An optical repeater, comprising:
a demultiplexer configured to divide an inputted light into two components;
a single semiconductor optical amplifier having two separate input paths configured to input said two components of light outputted from said demultiplexer, each of said input paths of said semiconductor optical amplifier including an active layer that has one type of structure selected from a group composed of a quantum dot, a quantum wire, a quantum dash, and a quantum well, configured to amplify both of said components of a light outputted from said demultiplexer; and
a multiplexer configured to couple two components of a light separately outputted from said semiconductor optical amplifier,
wherein said demultiplexer is a polarization beam splitter configured to divide the inputted light into two components that are orthogonal to each other.

2. The optical repeater according to claim 1, wherein said demultiplexer divides the inputted light into a TE wave and a TM wave.

3. The optical repeater according to claim 1, wherein said demultiplexer and said multiplexer are monolithically integrated with said semiconductor optical amplifier.

4. The optical repeater according to claim 1, wherein said demultiplexer and said multiplexer are integrated as a PLC with said semiconductor optical amplifier.

5. The optical repeater according to claim 1, further comprising:
a variable optical attenuator for attenuating a light outputted from said multiplexer;
an output detector for detecting an intensity of a light outputted from said variable optical attenuator; and
an output controller for controlling an intensity of an output signal by controlling operation of said variable optical attenuator based on the intensity detected by said output detector.

6. The optical repeater according to claim 1, further comprising:
an input detector for detecting an intensity of the inputted light;
a variable optical attenuator for attenuating a light outputted from said multiplexer;
an output detector for detecting an intensity of a light outputted from said variable optical attenuator; and
a gain controller for controlling a gain by controlling operation of said variable optical attenuator based on the intensity detected by said input detector and the intensity detected by said output detector.

7. The optical repeater according to claim 5, wherein said variable optical attenuator and said output detector are monolithically integrated with said semiconductor optical amplifier.

8. The optical repeater according to claim 5, wherein said variable optical attenuator and said output detector are integrated as a PLC with said semiconductor optical amplifier.

9. The optical repeater according to claim 6, wherein said input detector, said variable optical attenuator and said output detector are monolithically integrated with said semiconductor optical amplifier.

10. The optical repeater according to claim 6, wherein said input detector, said variable optical attenuator and said output detector are integrated as a PLC with said semiconductor optical amplifier.

11. The optical repeater according to claim 1, further comprising a gain equalizer for controlling a gain of a light outputted from said semiconductor optical amplifier within a range within a predetermined wavelength band.

12. The optical repeater according to claim 11 wherein said gain equalizer is integrated on a semiconductor substrate with said semiconductor optical amplifier.

13. The optical repeater according to claim 1 wherein said optical repeater is used as a 1R repeater.

* * * * *